US011073336B2

(12) United States Patent
Chen

(10) Patent No.: US 11,073,336 B2
(45) Date of Patent: Jul. 27, 2021

(54) SHELL HEAT DISSIPATING STRUCTURE OF SMALL FORM-FACTOR PLUGGABLE TRANSCEIVER

(71) Applicant: JESS-LINK PRODUCTS CO., LTD., New Taipei (TW)

(72) Inventor: Chun-Hua Chen, New Taipei (TW)

(73) Assignee: JESS-LINK PRODUCTS CO., LTD., New Taipei (TW)

( * ) Notice: Subject to any disclaimer, the term of this patent is extended or adjusted under 35 U.S.C. 154(b) by 119 days.

(21) Appl. No.: 16/661,565

(22) Filed: Oct. 23, 2019

(65) Prior Publication Data
US 2020/0309458 A1 Oct. 1, 2020

(30) Foreign Application Priority Data

Mar. 29, 2019 (TW) ................. 108111308

(51) Int. Cl.
*F28D 1/02* (2006.01)
*H01L 23/367* (2006.01)
(Continued)

(52) U.S. Cl.
CPC ........ *F28D 1/0233* (2013.01); *H01L 23/3675* (2013.01); *F28D 2021/0028* (2013.01);
(Continued)

(58) Field of Classification Search
CPC ........... F28D 1/0233; F28D 2021/0028; F28D 2021/0029; H05K 7/20; H05K 7/2039;
(Continued)

(56) References Cited

U.S. PATENT DOCUMENTS 6,986,679 B1 * 1/2006 Aronson ................ H01R 25/00
439/170
7,625,223 B1 * 12/2009 Fogg ..................... H05K 5/0247
361/715
(Continued)

FOREIGN PATENT DOCUMENTS

| CN | 2466698 Y | 12/2001 |
| TW | 201729471 A | 8/2017 |
| TW | M585471 U | 10/2019 |

OTHER PUBLICATIONS

Office Action dated Mar. 5, 2021 of the corresponding Taiwan patent application No. 108111308.

*Primary Examiner* — Jianying C Atkisson
*Assistant Examiner* — Jose O Class-Quinones
(74) *Attorney, Agent, or Firm* — Chun-Ming Shih; HDLS IPR Services

(57) ABSTRACT

A shell heat dissipating structure of a small form-factor transceiver includes a hollow shell and a heat dissipating structure. The hollow shell has a setting surface disposed on the outside; the setting surface is formed along an extending direction of the hollow shell. The heat dissipating structure has plural fins formed along the extending direction of the hollow shell and spaced on the setting surface; a plurality of channels is formed among the fins. Each of the fins is formed by plural projecting portions and recess portions disposed along the extending direction and alternated continuously such that the channels among the fins communicate with each other through the recess portions.

8 Claims, 5 Drawing Sheets

(51) Int. Cl.
*F28F 9/02* (2006.01)
*F28F 9/22* (2006.01)
*F28D 21/00* (2006.01)

(52) U.S. Cl.
CPC .............. *F28F 9/0229* (2013.01); *F28F 9/22* (2013.01); *F28F 2215/00* (2013.01)

(58) Field of Classification Search
CPC ........... H05K 7/20418; H05K 7/20445; H05K 7/20472; H05K 7/2049; H05K 7/20509; H05K 7/20854; H05K 7/209; H01L 21/4878; H01L 21/4882; H01L 23/36; H01L 23/3672; H01L 23/40; H01L 2023/4062; H01L 23/4093; H01L 23/3675; H01L 23/467; F28F 3/04; F28F 2215/00; G02B 6/4269; G02B 6/0085; G02B 6/3814; G02B 6/4256
See application file for complete search history.

(56) References Cited

U.S. PATENT DOCUMENTS

| | | | | |
|---|---|---|---|---|
| 7,646,615 | B2 * | 1/2010 | Ice | H05K 9/0058 361/818 |
| 7,764,504 | B2 * | 7/2010 | Phillips | H01R 13/6582 361/715 |
| 7,794,241 | B2 * | 9/2010 | Bright | H01R 12/721 439/79 |
| 9,389,368 | B1 * | 7/2016 | Sharf | G02B 6/4269 |
| 9,608,377 | B1 * | 3/2017 | Phillips | H01R 13/7175 |
| 9,668,379 | B1 * | 5/2017 | Bucher | H01R 13/514 |
| 9,935,403 | B1 * | 4/2018 | Briant | H01R 13/6583 |
| 10,104,760 | B1 * | 10/2018 | Briant | G02B 6/4284 |
| 10,128,627 | B1 * | 11/2018 | Kazav | G02B 6/4269 |
| 2003/0016495 | A1 * | 1/2003 | Hongo | G06F 1/203 361/679.48 |
| 2003/0072540 | A1 * | 4/2003 | Huang | H05K 9/0058 385/92 |
| 2003/0136545 | A1 * | 7/2003 | Lin | H01L 23/467 165/80.3 |
| 2003/0161108 | A1 * | 8/2003 | Bright | G02B 6/4277 361/707 |
| 2005/0148223 | A1 * | 7/2005 | Shirk | G02B 6/4246 439/160 |
| 2005/0195565 | A1 * | 9/2005 | Bright | H04B 1/036 361/688 |
| 2007/0110374 | A1 | 5/2007 | Oki et al. | |
| 2007/0183128 | A1 * | 8/2007 | Pirillis | H05K 7/20418 361/715 |
| 2007/0256812 | A1 * | 11/2007 | Wei | H01L 23/467 165/80.3 |
| 2008/0137306 | A1 * | 6/2008 | Kim | H01R 13/6594 361/709 |
| 2009/0109627 | A1 * | 4/2009 | Murr | H05K 7/20418 361/704 |
| 2013/0210269 | A1 * | 8/2013 | Neer | H05K 7/20145 439/487 |
| 2014/0153192 | A1 * | 6/2014 | Neer | H05K 9/0058 361/704 |
| 2014/0349514 | A1 * | 11/2014 | Yang | H05K 7/2039 439/487 |
| 2016/0149324 | A1 | 5/2016 | Regnier | |
| 2016/0211623 | A1 * | 7/2016 | Sharf | G02B 6/4269 |
| 2017/0054234 | A1 * | 2/2017 | Kachlic | H01R 13/6594 |
| 2017/0168253 | A1 * | 6/2017 | Wilcox | G02B 6/4277 |
| 2018/0310435 | A1 * | 10/2018 | Sharf | H05K 7/20409 |
| 2019/0013617 | A1 * | 1/2019 | Ayzenberg | H05K 9/0058 |

* cited by examiner

SHELL HEAT DISSIPATING STRUCTURE OF SMALL FORM-FACTOR PLUGGABLE TRANSCEIVER

BACKGROUND OF THE INVENTION

Field of the Invention

The present invention relates to an electrical connector, and in particular, to a shell heat dissipating structure of a small form-factor pluggable transceiver.

Description of Prior Art

The quad small form-factor pluggable (QSFP) transceiver is a small hot plugging optical transceiver which is used in optical communication applications such as telecommunications and network communications and is one of the optical devices complying with the standard specifications.

However, with the increasing transmission speed, the high temperature is caused during the operation and results in the issue of heat dissipation. As for the existing QSFP, there is no heat dissipating structure disposed or only plural fins disposed on the external surface thereof. Because the issue of heat dissipation cannot be resolved by the fin design, it still needs to be improved.

In view of this, the inventor pays special attention to research with the application of related theory and tries to improve and overcome the above disadvantages regarding the prior art, which becomes the improvement target of the inventor.

SUMMARY OF THE INVENTION

The main objective of the present invention is to provide a shell heat dissipating structure of a small form-factor pluggable transceiver, which further improves the heat dissipating structure of the QSFP and increases the efficiency of heat dissipation through enhanced forced heat convection.

To achieve the above objective, the present invention provides a shell heat dissipating structure of a small form-factor pluggable transceiver, which comprises a hollow shell and a heat dissipating structure. The hollow shell has a setting surface disposed on the outside; the setting surface is formed along an extending direction of the hollow shell. The heat dissipating structure has plural fins formed along the extending direction of the hollow shell and spaced on the setting surface; a plurality of channels is formed among the fins. Each of the fins is formed by plural projecting portions and recess portions disposed along the extending direction and alternated continuously such that the channels among the fins communicate with each other through the recess portions.

DETAILED DESCRIPTION OF THE INVENTION

The detailed description and technical details of the present invention will be explained below with reference to accompanying drawings. However, the accompanying figures are only for reference and explanation, but not to limit the scope of the present invention.

Figure 1:
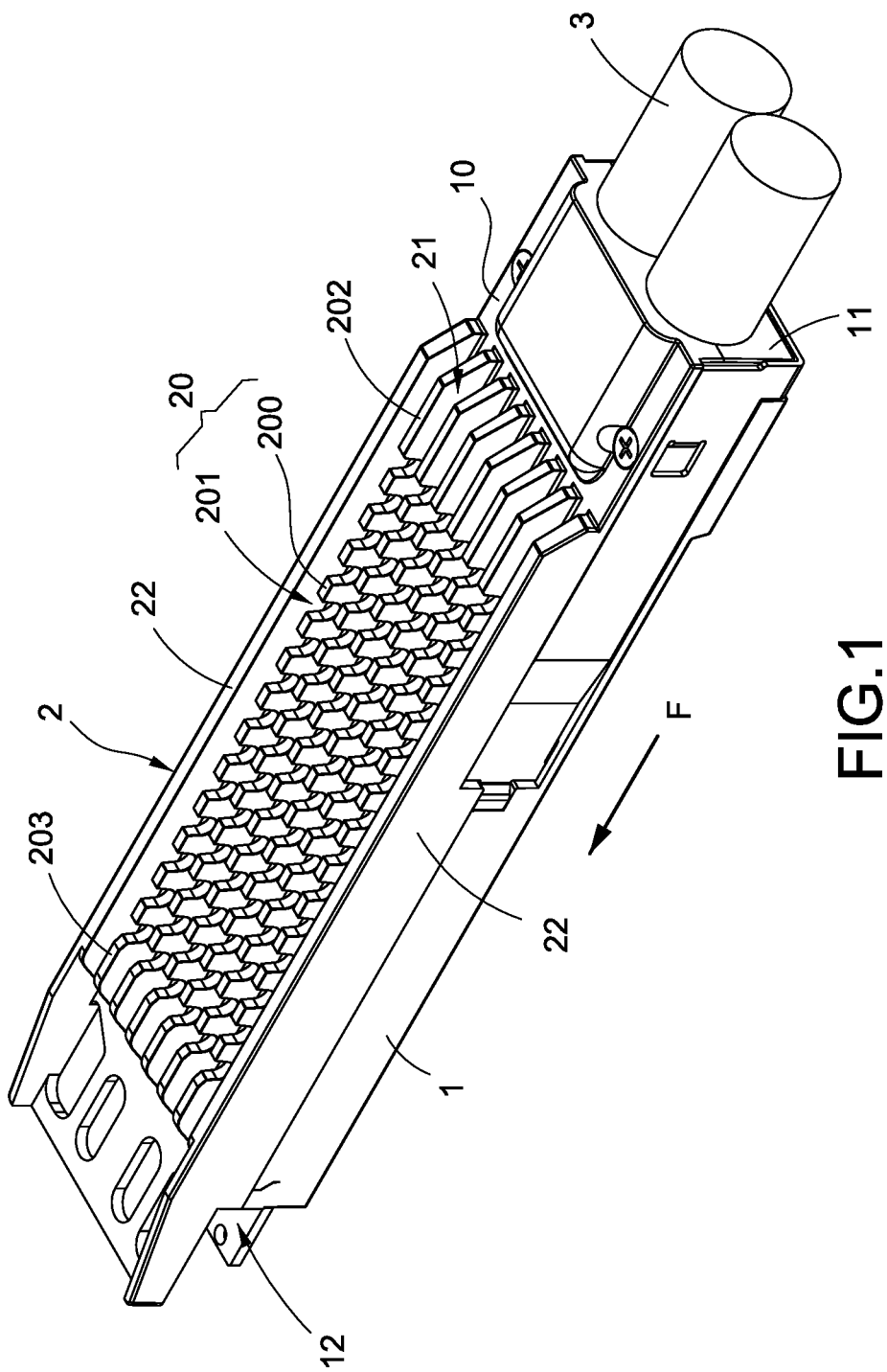
FIG. 1 is a perspective view of the shell heat dissipating structure according to the first embodiment of the present invention.
Figure 2:
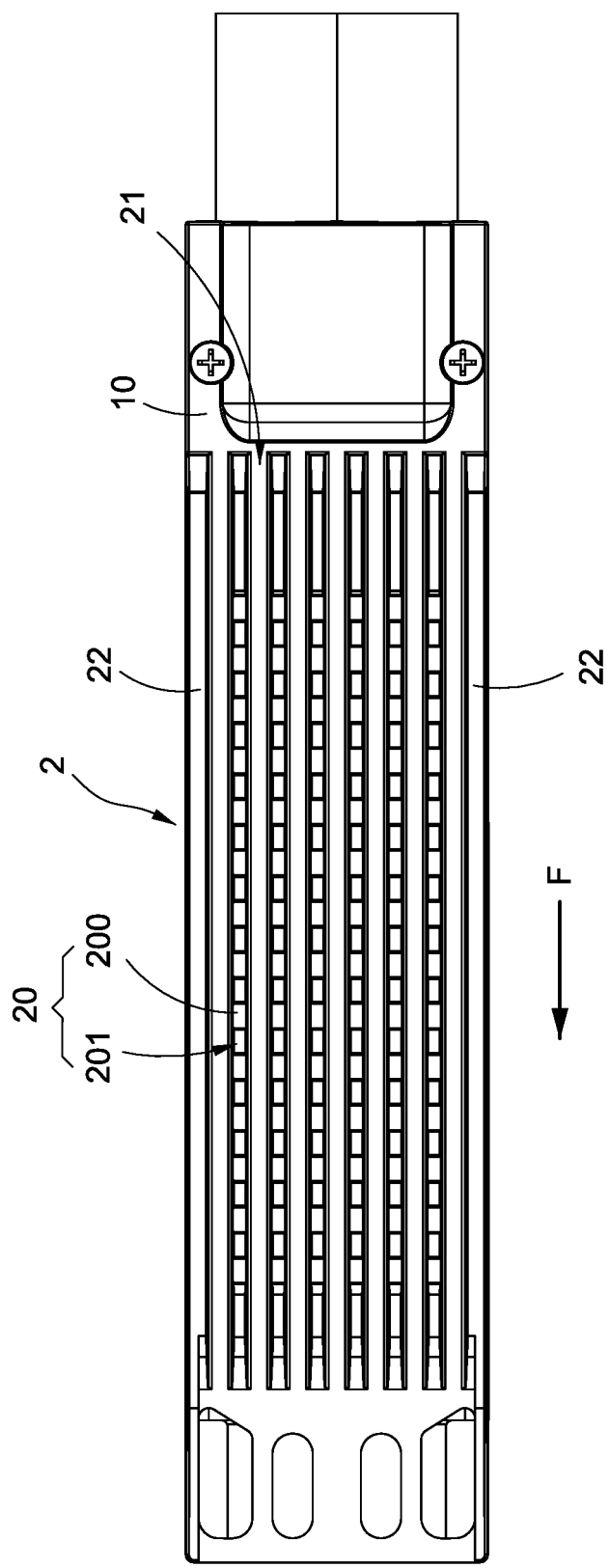
FIG. 2 is a top view of the shell heat dissipating structure according to the first embodiment of the present invention.
Figure 3:
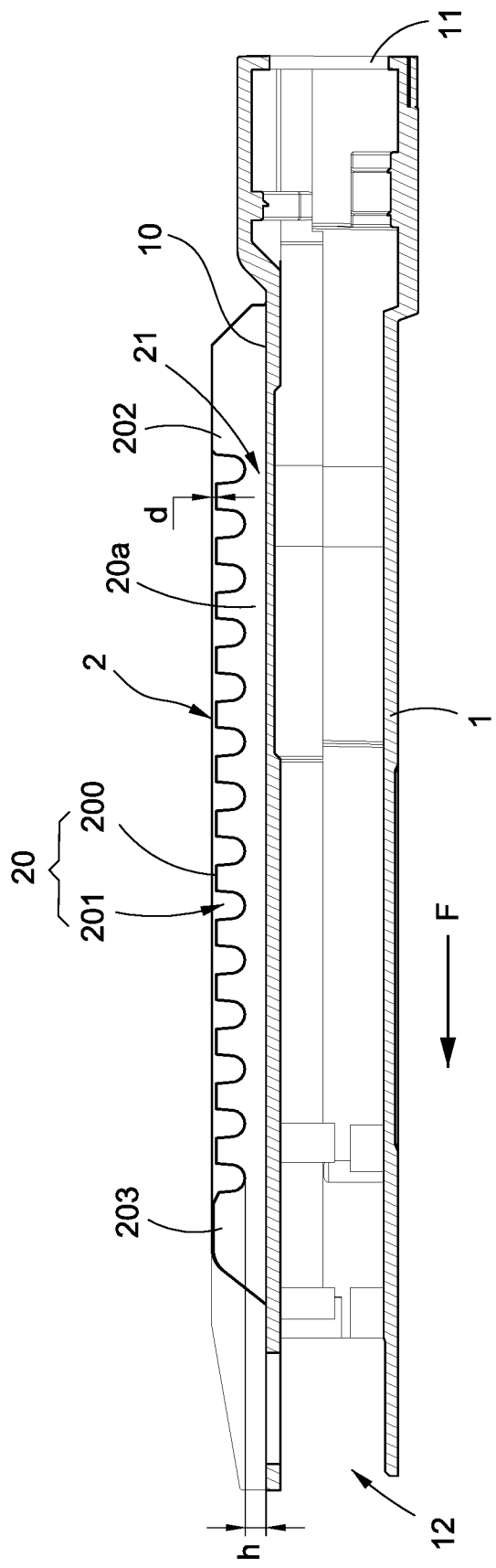
FIG. 3 is a side cross-sectional view of the shell heat dissipating structure according to the first embodiment of the present invention.

Please refer to FIGS. 1-3, which are the perspective view, the top view, and the side cross-sectional view of the shell heat dissipating structure according to the first embodiment of the present invention, respectively. The present invention provides a shell heat dissipating structure of a small form-factor transceiver, which comprises a hollow shell 1 and a heat dissipating structure 2 disposed on the hollow shell 1.

The hollow shell 1 may be made of aluminum or aluminum alloy which has higher thermal conductivity. The hollow shell 1 has a bar-like shape according to the general specifications and is hollow as shown in FIG. 3, which can receive the electronic device (not shown) such as the QSFP and the printed circuit board. The hollow shell 1 has a setting surface 10 disposed on the outside; the setting surface 10 is formed along the extending direction F of the hollow shell 1 having the bar-like shape. Further, the hollow shell 1 has two ports 11, 12. The port 11 is used for electrical connection with the cable 3; the port 12 is used to connect the counterpart connector (not shown). These two ports 11, 12 are individually disposed at two ends of the hollow shell 1 along the extending direction F of the bar-like shape such that the two ports 11, 12 communicate with each other and penetrate through the hollow shell 1. The setting surface 10 is formed extending from the port 11 toward the port 12.

The heat dissipating structure 2 may be formed integrally on the hollow shell 1 and has a plurality of fins 20 spaced on the setting surface 10. The fins 20 are individually formed along the extending direction F of the hollow shell 1 such that a plurality of channels 21 is formed along the extending direction F and among the fins 20 as shown in FIG. 2. Furthermore, each of the fins 20 is formed by a plurality of projecting portions 200 and recess portions 201 disposed along the extending direction F and alternated continuously. In this way, the formation of the channels 21 is maintained by the projecting portions 200 and the recess portions 201. Also, the channels 21 among the fins 20 can communicate with each other through the recess portions 201, which can increase the efficiency of heat dissipation by means of the uniform heat dissipation of the respective channels 21.

In an embodiment of the present invention, two stop plates 22 are formed individually on each of two outermost edges of the setting surface 10. The two stop plates 22 are also formed along the extending direction F such that the fins 20 are all disposed between the two stop plates 22, which keeps all the channels 21 communicate with each other at the recess portions 201 of the fins 20. Moreover, as shown in FIG. 3, the height of each of the two stop plates 22 may be greater than that of each of the projecting portions 200 such that a height difference d exists between the top edge of the stop plate 11 and the top edge of the projecting portion 200. As a result, such a design can smooth the plugging of the connectors. In addition, a root 20a may be pre-figured at the junction of each of the fins 20 and the setting surface 10; the height h of the root 20a roughly reaches the bottom of the recess portion 201 such that the projecting portions 200 and the recess portions 201 are integrally formed on the upper edge of the root 20a. Also, the front end and the rear end of the root 20a are provided with a first guiding portion 202 and a second guiding portion 203, respectively; the lengths of the first guiding portion 202 and the second guiding portion 203 are greater than those of the projecting portions 200 in the extending direction F such that the flow directions of the respective channels 21 at the front and the rear ends are quite consistent with the extending direction F. Besides, the heights of the first guiding portion 202 and the second guiding portion 203 may be greater than those of the projecting portions 200 to be flush with the two stop plates 22.

Figure 4:
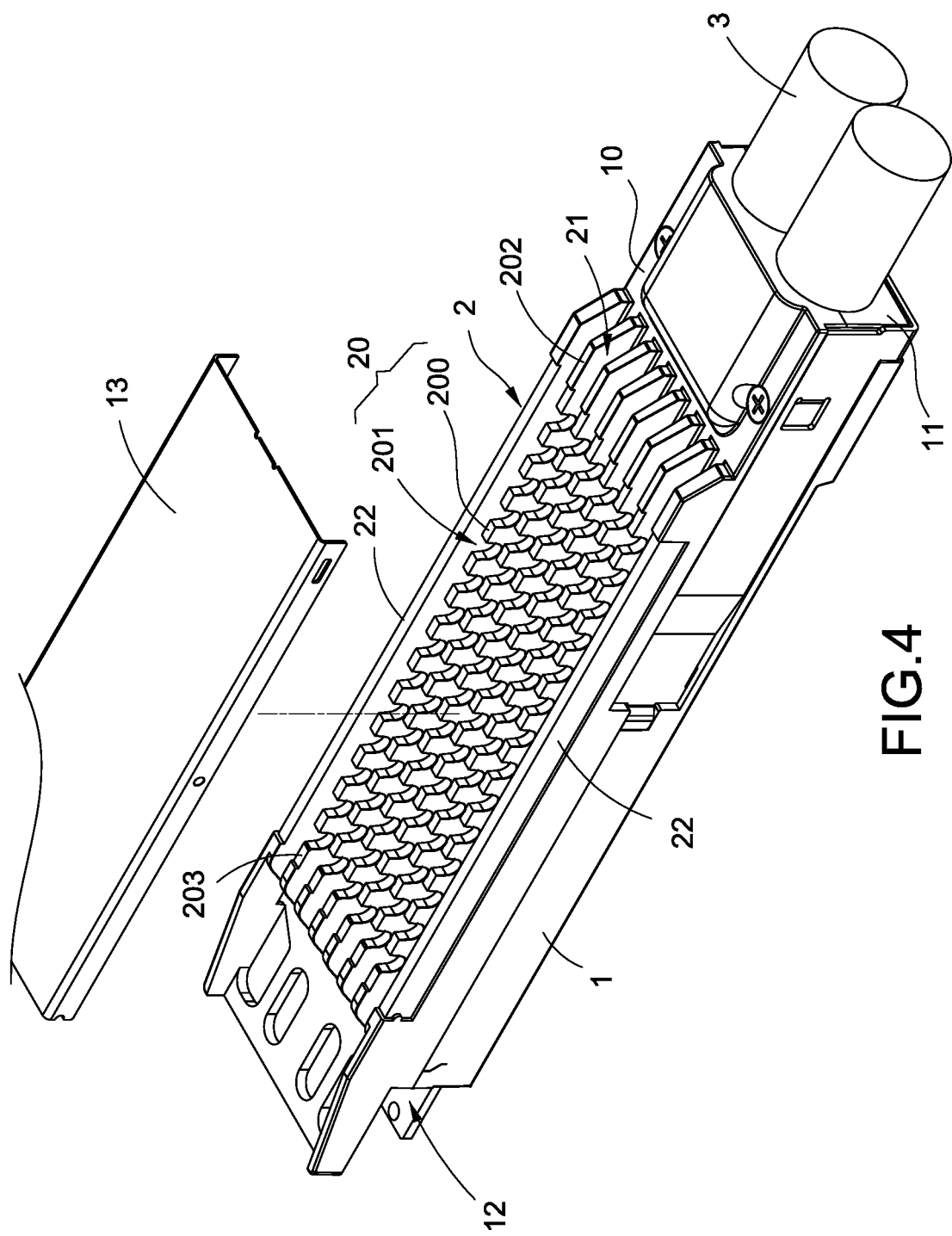
FIG. 4 is a perspective exploded view of the shell heat dissipating structure according to the second embodiment of the present invention.
Figure 5:
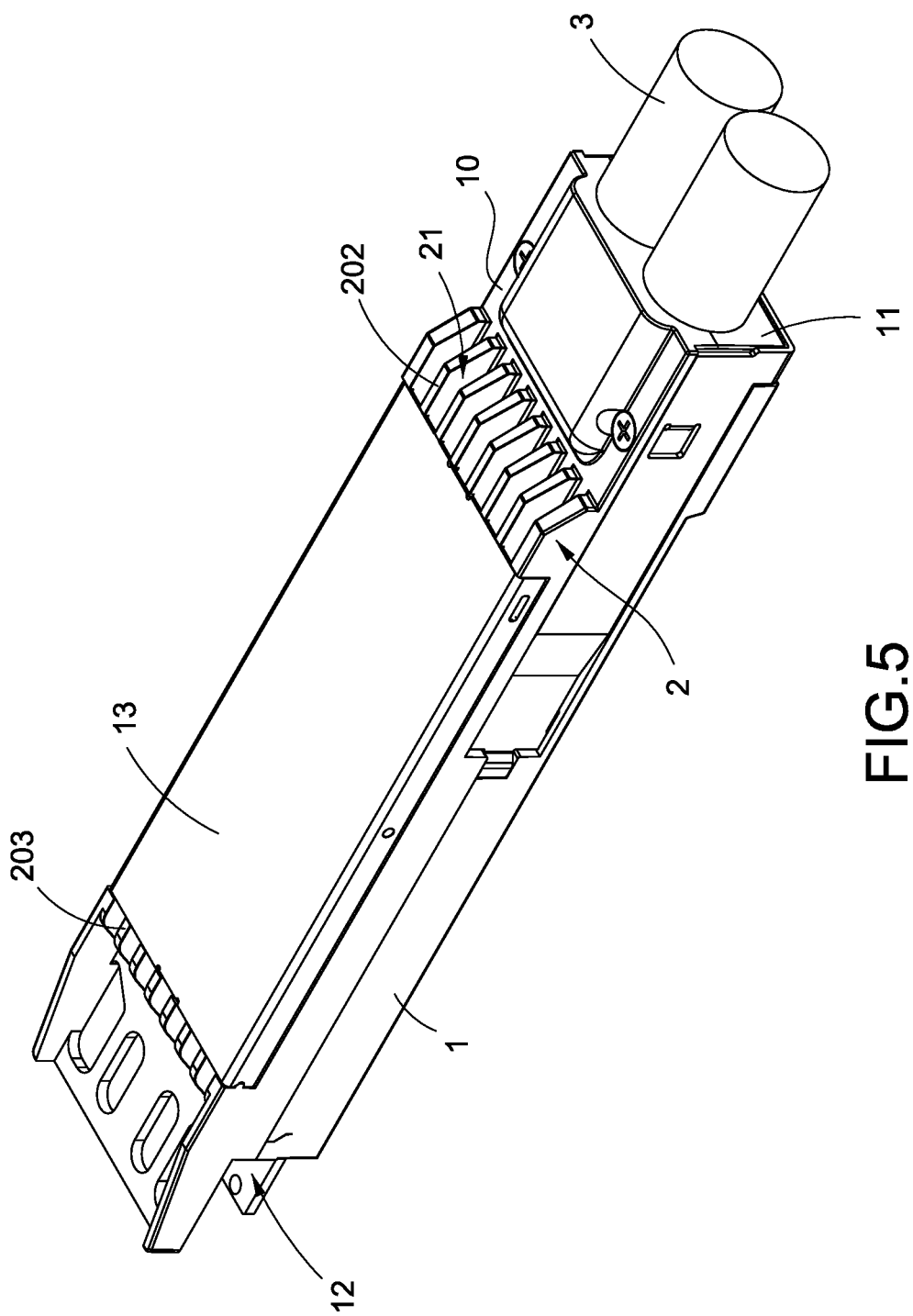
FIG. 5 is a perspective assembled view of the shell heat dissipating structure according to the second embodiment of the present invention.

Furthermore, FIGS. 4 and 5 are the perspective exploded view and the perspective assembled view of the shell heat dissipating structure according to the second embodiment of the present invention, respectively. The heat dissipating structure 2 in the present invention further comprises an air shroud 13 disposed on the heat dissipating structure 2. The air shroud 13 mainly covers the channels 21 up such that the channels 21 and the air shroud 13 form together the wind tunnels to facilitate the air flow. In the current embodiment of the present invention, the air shroud 13 crosses and covers the two stop plates 22 to include the tops of the respective channels 21, and can be flush with the first guiding portion 202 and the second guiding portion 203. In a preferable design, the air shroud 13 can cover only the area where the fins 20 have the projecting portions 200 and the recess portions 201, exposing the first guiding portions 202 and the second guiding portions 203 of the respective fins 20. In this way, the external air can easily flow into the respective channels 21 to enhance the heat dissipation by heat convection.

Therefore, by means of the combination of the above-mentioned structures, the shell heat dissipating structure of a small form-factor pluggable transceiver can be obtained.

In summary, the present invention indeed achieves the expected objectives and overcomes the problems of the prior art. Also, the present invention is novel, useful, and non-obvious to be patentable. Please examine the application carefully and grant it as a formal patent for protecting the rights of the inventor.

The embodiments disclosed above are only preferred embodiments of the present invention, but not to limit the scope of the present invention. The scope of the present invention should be embraced by the accompanying claims and includes all the equivalent modifications and not be limited to the previous description.

What is claimed is:

1. A shell heat dissipating structure of a small form-factor pluggable transceiver, comprising:
   a hollow shell having a setting surface disposed on the outside, wherein the setting surface is formed along an extending direction of the hollow shell; and
   a heat dissipating structure having a plurality of fins formed along the extending direction of the hollow shell and spaced on the setting surface, wherein a plurality of channels is formed among the fins, wherein each of the fins is formed by a plurality of projecting portions and recess portions disposed along the extending direction and alternated continuously such that the channels among the fins communicate with each other through the recess portions,
   wherein a root is pre-figured at the junction of each of the fins and the setting surface such that the projecting portions and the recess portions are integrally formed on the upper edge of the root,
   the front end and the rear end of the root along the extending direction are provided with a first guiding portion and a second guiding portion, respectively, wherein the lengths of the first guiding portion and the second guiding portion are greater than those of the projecting portions in the extending direction, wherein the heights of the first guiding portion and the second guiding portion are greater than those of the projecting portions.

2. The shell heat dissipating structure of a small form-factor pluggable transceiver according to claim 1, wherein the hollow shell has a bar-like shape, wherein the setting surface is formed along the extending direction of the hollow shell having the bar-like shape.

3. The shell heat dissipating structure of a small form-factor pluggable transceiver according to claim 2, wherein the hollow shell has two ports which are individually disposed at two ends of the hollow shell along the extending direction of the bar-like shape, wherein the two ports communicate with each other and penetrate through the hollow shell.

4. The shell heat dissipating structure of a small form-factor pluggable transceiver according to claim 1, wherein the heat dissipating structure is formed integrally on the hollow shell.

5. The shell heat dissipating structure of a small form-factor pluggable transceiver according to claim 1, wherein the heat dissipating structure has two stop plates formed individually on each of two outermost edges of the setting surface, wherein the two stop plates are formed along the extending direction such that the fins are disposed between the two stop plates, wherein the height of each of the two stop plates is greater than that of each of the projecting portions.

6. The shell heat dissipating structure of a small form-factor pluggable transceiver according to claim 1, further comprising an air shroud disposed on the heat dissipating structure.

7. The shell heat dissipating structure of a small form-factor pluggable transceiver according to claim 6, wherein the heat dissipating structure has two stop plates formed individually on each of two outermost edges of the setting surface, wherein the two stop plates are formed along the extending direction such that the fins are disposed between the two stop plates, wherein the air shroud crosses and covers the two stop plates.

8. The shell heat dissipating structure of a small form-factor pluggable transceiver according to claim 6, wherein the air shroud covers only the area where the fins have the projecting portions and the recess portions.

* * * * *